(12) United States Patent
Stevenson

(10) Patent No.: US 10,404,164 B1
(45) Date of Patent: Sep. 3, 2019

(54) FLOATING CHARGE PUMP

(71) Applicant: Smart Prong Technologies, Inc., Irvine, CA (US)

(72) Inventor: Brian Stevenson, Rancho Santa Margarita, CA (US)

(73) Assignee: Smart Prong Technologies, Inc., Irvine, CA (US)

( * ) Notice: Subject to any disclaimer, the term of this patent is extended or adjusted under 35 U.S.C. 154(b) by 0 days.

(21) Appl. No.: 16/156,877

(22) Filed: Oct. 10, 2018

(51) Int. Cl.
*G05F 1/10* (2006.01)
*H02M 3/07* (2006.01)

(52) U.S. Cl.
CPC .................................. *H02M 3/07* (2013.01)

(58) Field of Classification Search
CPC .......... H02M 3/07; H02M 3/10; H02M 3/125; H02M 3/135; H02M 3/137; H02M 3/142; H02M 2003/072; G11C 5/145; G05F 1/462
See application file for complete search history.

(56) References Cited

U.S. PATENT DOCUMENTS

| | | | | | |
|---|---|---|---|---|---|
| 7,728,651 | B2* | 6/2010 | Nakai | ..................... | H02M 3/07 327/111 |
| 7,821,326 | B2* | 10/2010 | Yeh | ........................ | H02M 3/073 327/536 |
| 8,072,257 | B2* | 12/2011 | Ootani | .................. | H02M 3/073 327/536 |
| 2002/0125920 | A1* | 9/2002 | Stanley | ................... | H02M 1/08 327/108 |

\* cited by examiner

*Primary Examiner* — An T Luu
(74) *Attorney, Agent, or Firm* — Maschoff Brennan

(57) ABSTRACT

A system may include first and second node, switch, driver, capacitor, and second driver. The first node may be at first voltage. The second node may be at second voltage. The switch may be coupled to the second node and output of the second driver and configured to receive input at third voltage and voltage at fourth voltage and to provide the input to the second node when the fourth voltage is greater than the third voltage. The driver may be coupled to the first and second nodes and configured to receive driver input and to generate intermediate voltage based on the driver input. The capacitor may be coupled to the driver to shift the intermediate voltage. The second driver may be coupled to the second node and the driver and configured to receive second driver input and the shifted intermediate voltage to generate the voltage at the fourth voltage.

20 Claims, 2 Drawing Sheets

FLOATING CHARGE PUMP

FIELD

The embodiments discussed in the present disclosure are related to a floating charge pump.

BACKGROUND

The use of electronic devices is a useful tool for work, personal, and entertainment uses. Despite the proliferation of electronic devices, there still remains various limitations for delivering power to electronic devices.

The subject matter claimed in the present disclosure is not limited to embodiments that solve any disadvantages or that operate only in environments such as those described above. Rather, this background is only provided to illustrate one example technology area where some embodiments described in the present disclosure may be practiced.

SUMMARY

One or more embodiments of the present disclosure may include a system for implementing a floating charge pump. The system may include a first node. The first node may be at a first voltage level. The system may also include a second node. The second node may be at a second voltage level. Additionally, the system may include a switching circuit electrically coupled to the second node. The switching circuit may be configured to receive an input signal at a third voltage level and a voltage signal at a fourth voltage level. The switching circuit may also be configured to provide the input signal to the second node when the fourth voltage level of the voltage signal is greater than the third voltage level of the input signal. The second voltage level may be equal to the third voltage level when the switching circuit provides the input signal to the second node. Furthermore, the system may include a first driver electrically coupled to the first node and the second node. The first driver may be configured to receive a first driver input signal. The first driver may also be configured to generate an intermediate voltage signal at an intermediate voltage level based on the first driver input signal. The intermediate voltage level may be between the first voltage level and the second voltage level. The system may include a first capacitive circuit electrically coupled to an output of the first driver. The first capacitive circuit may be configured to level shift the intermediate voltage signal to a level shifted voltage level. The system may also include a second driver electrically coupled to the second node and an output of the first driver. Likewise, an output of the second driver may be electrically coupled to the switching circuit. The second driver may be configured to receive a second driver input signal and the level shifted intermediate voltage signal. The second driver may also be configured to generate the voltage signal at the fourth voltage level based on the second driver input signal. The fourth voltage level may be between the level shifted intermediate voltage level and the second voltage level.

The object and advantages of the embodiments will be realized and achieved at least by the elements, features, and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

Example embodiments will be described and explained with additional specificity and detail through the use of the accompanying drawings in which.

DETAILED DESCRIPTION

Figure 1:
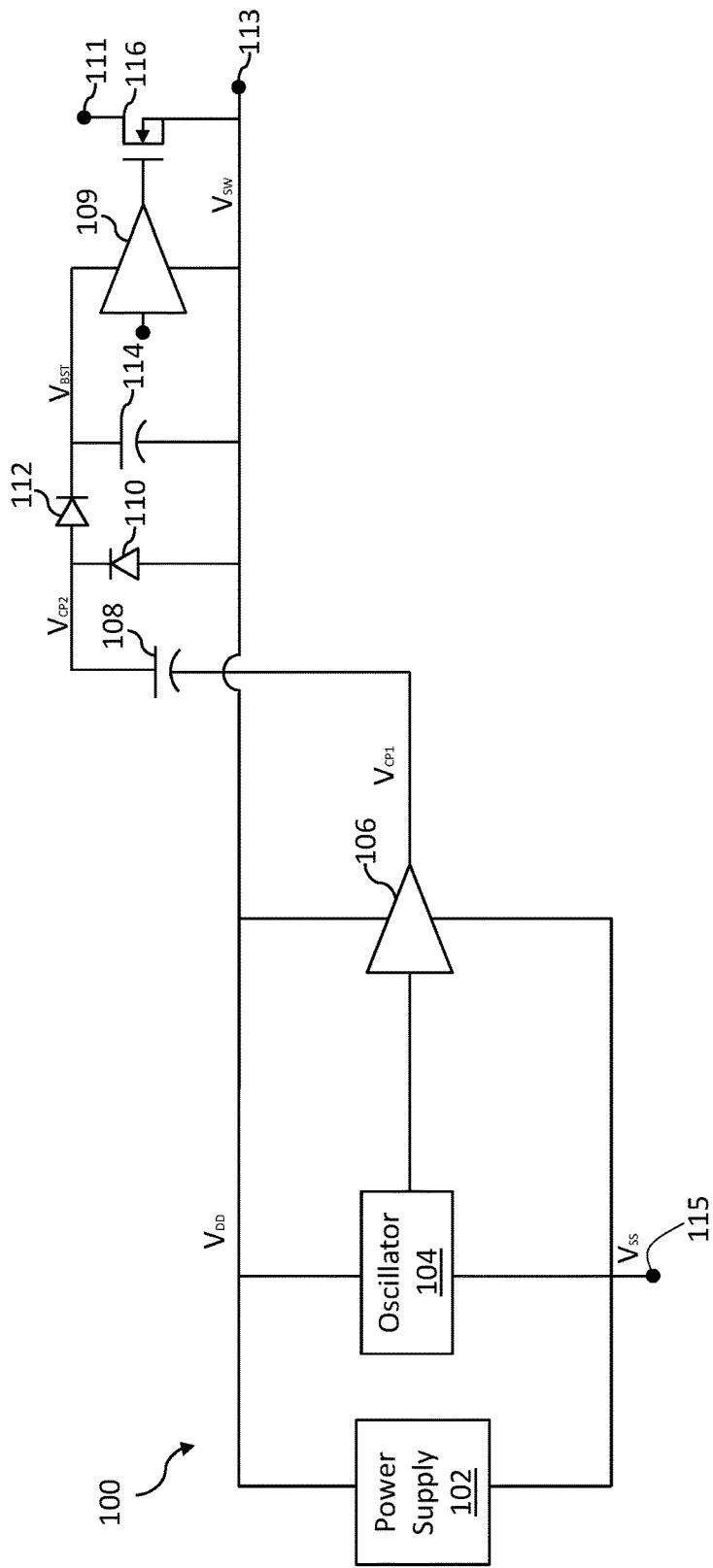
FIG. 1 illustrates an example system of electrical components implementing a floating charge pump.

N-channel field effect transistors (NFETs) may be efficient transistors for propagating a voltage signal, a power signal, and/or a current signal. In order for an NFET to turn on (e.g., transition from an open position to a closed position so as to propagate the signal from a drain to a source of the NFET) a voltage level of a signal on a gate of the NFET must be greater than a voltage level of the signal on the source of the NFET. A charge pump may be used to provide the voltage signal that causes the NFET to propagate the signal. In conventional charge pumps, voltage levels of the various signals within the charge pump may be based on a ground reference voltage (e.g., may use earth ground (e.g., zero volts) as a reference voltage level).

Conventional charge pumps may include an oscillator and a driver that operate based on a zero volt voltage level of the ground reference signal and a five volt voltage level of a voltage reference signal. In these conventional charge pumps, the driver may output an intermediate voltage signal that includes a voltage level that varies between zero volts and five volts. Additionally, in high voltage systems (e.g., systems that operate at or above fifty volts), a high voltage capacitor may be used to store a high voltage charge to compensate for a voltage difference between the intermediate voltage level and the high voltage level needed at the gate of the NFET to cause the NFET to transition to the closed position.

High voltage capacitors may include large circuit footprints, which may increase cost associated with building conventional charge pumps. Additionally, dissipating a high voltage charge stored on the high voltage capacitor may increase the need for heat sinks and other heat dissipation devices in conventional charge pumps.

Accordingly, embodiments described in the present disclosure are directed to an improved charge pump that addresses some or all of the shortcomings of conventional charge pumps in high voltage systems. In some embodiments, an NFET may receive at a drain an input signal at a high voltage level. In order to cause the NFET to propagate the input signal, a voltage level of a voltage signal at a gate of the NFET must be greater than the high voltage level of the input signal.

In some embodiments, the charge pump may include a first driver electrically coupled to a first node and a second node. The first node may be at a first voltage level and the second node may be at a second voltage level. In some embodiments, the second voltage level may be equal to or similar to the high voltage level of the input signal. Additionally, the first voltage level may act as the ground reference voltage (e.g., the charge pump may float a voltage equal to the first voltage level above earth ground).

In some embodiments, the first driver may generate an intermediate voltage signal based on a first driver input signal using the first voltage level and the second voltage level as reference voltage levels. A voltage level of the intermediate voltage signal may vary between the first voltage level and the second voltage level. A low voltage capacitive circuit may be electrically coupled to the output of the first driver. The low voltage capacitive circuit may be rated for low voltage (e.g., voltage equal to or less than twenty volts). The low voltage capacitive circuit may receive the intermediate signal. Additionally, the low voltage capacitive circuit may store a low voltage charge substantially equal to the low voltage rating of the low voltage capacitive circuit. Furthermore, the low voltage capacitive circuit may output a level shifted intermediate voltage signal (e.g., may be configured to level shift the intermediate voltage signal to a level shifted voltage level). A voltage level of the level shifted intermediate voltage signal may be shifted up an amount substantially equal to the low voltage charge stored on the low voltage capacitive circuit.

In some embodiments, the charge pump may include a second driver. The second driver may be electrically coupled to the low voltage capacitive circuit, the second node, and the gate of the NFET. The second driver may generate a voltage signal based on a second driver input signal using the second voltage level and the voltage level of the level shifted intermediate signal as reference voltage levels. A voltage level of the voltage signal may vary between the second voltage level and the voltage level of the level shifted intermediate voltage signal. In some embodiments, the voltage level of the level shifted intermediate voltage signal and the second voltage signal may be equal to or greater than the high voltage level of the input signal. In these embodiments, the voltage level of the voltage signal may cause the NFET to propagate the input signal from the drain to the source of the NFET. Additionally, the various components of the charge pump may be exposed to a voltage difference that is substantially the same or similar to a voltage difference between the first voltage level, the second voltage level, and/or the voltage level of the level shifted intermediate voltage signal.

The inclusion of the low voltage capacitor in the charge pump may cause a circuit footprint of the charge pump to be relatively smaller than conventional charge pumps that include high voltage capacitors. Additionally, the circuit footprint of the charge pump may be reduced even more compared to conventional charge pumps since heat dissipation components and/or voltage dissipation components may be reduced due to voltages stored in the capacitors in the charge pump being low voltages. Furthermore, since voltages stored in the capacitors are low voltages, an amount of voltage that needs to be dissipated when the charge pump is powered down may be reduced compared to conventional charge pumps that include high voltage capacitors.

Embodiments of the present disclosure are explained with reference to the accompanying drawings.

FIG. 1 illustrates an example system 100 of electrical components implementing a floating charge pump 101, in accordance with one or more embodiments of the present disclosure. The floating charge pump 101 may include a power supply 102, an oscillator 104, a first driver 106, a first capacitive circuit 108, a second capacitive circuit 114, a first diode 112, a second diode 110, and a second driver 109. The floating charge pump 101 may be used to operate a field effect transistor (FET) 116 (referred to herein as "transistor 116"). In some embodiments, the transistor 116 (e.g., a switching circuit) may include an NFET. The transistor 116 may include a gate, a drain, and a source.

The power supply 102 may be electrically coupled to a first node 115 and a second node 113. A first reference input of the oscillator 104 may be electrically coupled to the second node 113. A second reference input of the oscillator 104 may be electrically coupled to the first node 115. An output of the oscillator 104 may be electrically coupled to an input of the first driver 106. A second reference input of the first driver 106 may be electrically coupled to the first node 115. A first reference input of the first driver 106 may be electrically coupled to the second node 113. An output of the first driver 106 may be electrically coupled to a first end of the first capacitive circuit 108. A second end of the first capacitive circuit 108 may be electrically coupled to an anode end of the first diode 112 and a cathode end of the second diode 110.

A cathode end of the first diode 112 may be electrically coupled to a first reference input of the second driver 109 and a second end of the second capacitive circuit 114. Additionally, a first end of the second capacitive circuit 114 may be electrically coupled to the second node 113. An anode end of the second diode 110 may be electrically coupled to the second node 113. A second reference input of the second driver 109 may be electrically coupled to the second node 113. An output of the second driver 109 may be electrically coupled to the gate of the transistor 116. The source of the transistor 116 may be electrically coupled to the second node 113. The drain of the transistor 116 may be electrically coupled to an input terminal 111.

The charge pump 101 may be configured to transition from a start-up state to a steady state. In the start-up state, the components within the charge pump 101 may be powering up and transitioning from non-operative states to operative states. In the steady state, the components within the charge pump 101 may have reached operative states.

The transistor 116 may receive an input signal at a high voltage level (e.g., a third voltage level) via the input terminal 111. The transistor 116 may be configured to transition between a closed position and an open position. In the closed position (e.g., when a voltage level on the gate of the transistor 116 is greater than the high voltage level on the source), the transistor 116 may propagate the input signal and may provide the input signal at the high voltage level to the second node 113 via the source. In the open position (e.g., when the voltage level on the gate of the transistor 116 is less than the high voltage level on the source), the transistor 116 may not propagate the input signal.

The first node 115 may be at a first voltage level $V_{SS}$. The charge pump 101 may operate using the first voltage level $V_{SS}$ as the lower reference voltage (e.g., the charge pump 101 may be floating at a voltage equal to the first voltage level $V_{SS}$ above earth ground). Therefore, in the steady state, the voltage levels of a second voltage level $V_{DD}$, an intermediate voltage signal at an intermediate voltage level $V_{CP1}$, the intermediate voltage signal at the level shifted voltage level $V_{CP2}$, the intermediate voltage signal at a rectified voltage level $V_{BST}$, and a voltage signal at a fourth voltage level $V_G$ may be equal to or greater than the first voltage level.

In the start-up state, the first voltage level $V_{SS}$ may transition from zero volts to a positive voltage. The first voltage level $V_{SS}$ may be obtained from a first voltage signal generated by an external voltage source or any other appropriate device electrically coupled to the first node 115. In some embodiments, the first voltage level $V_{SS}$ may be statically set, dynamically set, and/or configured by an operator.

The second node 113 may be at the second voltage level $V_{DD}$. In some embodiments, in the start-up state, the second voltage level $V_{DD}$ may transition from zero volts to a positive voltage. In the steady state, the second voltage level $V_{DD}$ may vary within a steady state range. In some embodiments, the second voltage level may be based on the high voltage level $V_{SW}$ of the input signal when propagated by the transistor 116. Additionally or alternatively, the second voltage level $V_{DD}$ may be based on a voltage charge $V_{SW}$ stored on an external device electrically coupled to the second node 113.

In some embodiments, an external device may be electrically coupled to the second node 113. For example, a flying capacitor may be electrically coupled to the second node 113 and the second voltage level $V_{DD}$ may be at least partially based on a voltage charge stored on and/or provided by the external device electrically coupled to the second node 113. Additionally or alternatively, the second voltage level $V_{DD}$ may be based on a summation of the high voltage level of the input signal and the voltage charge stored on and/or provided by the external device electrically coupled to the second node 113.

In some embodiments, the power supply 102 may regulate a voltage difference between the first node 115 and the second node 113. In these and other embodiments, the power supply 102 may be rated for a voltage within a power supply voltage range. The power supply voltage range may be between one volt and twenty volts. For example, the power supply 102 may be rated for five volts and the voltage difference between the first node 115 and the second node 113 may be substantially equal to five volts.

In some embodiments, the oscillator 104 may generate a first driver input signal using the first voltage level $V_{SS}$ and the second voltage level $V_{DD}$ as reference voltage levels. In these and other embodiments, the first driver input signal may be an alternating current (AC) signal in which a voltage level of the AC signal alternates between the first voltage level $V_{SS}$ and the second voltage level $V_{DD}$. Additionally or alternatively, a frequency of the AC signal may be adjusted based on the first voltage level $V_{SS}$ and the second voltage level $V_{DD}$.

The first driver 106 may receive the first driver input signal. The first driver 106 may generate an intermediate voltage signal at an intermediate voltage level $V_{CP1}$. The intermediate voltage signal may be a direct current (DC) signal. The intermediate voltage level $V_{CP1}$ may vary between the first voltage level $V_{SS}$ and the second voltage level $V_{DD}$. For example, in the steady state, the intermediate voltage level $V_{CP1}$ may vary between the first voltage level $V_{SS}$ and the high voltage level of the input signal and/or the voltage charge stored on and/or provided by the external device electrically coupled to the second node 113. Additionally, the first driver 106 may not generate the intermediate voltage signal when the second voltage level $V_{DD}$ is below a threshold voltage (e.g., when the charge pump 101 is in the start-up state). In some embodiments, the threshold voltage may be equal to or less than two volts.

In some embodiments, the first capacitive circuit 108 may receive the intermediate voltage signal at the intermediate voltage level $V_{CP1}$. In these and other embodiments, the intermediate voltage signal may drive the first capacitive circuit 108. In other embodiments, the first capacitive circuit 108 may be rated for a low voltage. For example, the low voltage rating may be equal to or less than twenty volts. The first capacitive circuit 108 may store a voltage charge substantially equal to the low voltage rating. In some embodiments, the first capacitive circuit 108 may store a DC voltage.

In some embodiments, the first capacitive circuit 108 may output the intermediate voltage signal at a level shifted voltage level $V_{CP2}$. The level shifted voltage level $V_{CP2}$ may vary between the second voltage level $V_{DD}$ and the second voltage level $V_{DD}$ plus the low voltage stored on the first capacitive circuit 108. A voltage difference between the intermediate voltage level $V_{CP1}$ and the level shifted voltage level $V_{CP2}$ may be equal to or less than the voltage charge stored on the first capacitive circuit 108.

The first diode 112 may receive the intermediate voltage signal at the level shifted voltage level $V_{CP2}$. In some embodiments, the first diode 112 may rectify the intermediate voltage signal. In these and other embodiments, the first diode 112 may output the intermediate voltage signal at a rectified voltage level $V_{BST}$. Additionally, the second capacitive circuit 114 may filter the voltage level $V_{BST}$. The rectified voltage level $V_{BST}$ may be the same as the low voltage stored on the first capacitive circuit 108.

In some embodiments, the second driver 109 may receive a second driver input signal via node 117. The second driver input signal may include an AC signal generated by a level shifted clock signal. Additionally, the second driver 109 may receive the intermediate voltage signal at the rectified voltage level $V_{BST}$ via the first reference input and the second voltage level $V_{DD}$ via the second reference input.

In some embodiments, the second driver 109 may generate a voltage signal at a fourth voltage level $V_G$. The voltage signal may be a DC signal. The fourth voltage level $V_G$ may vary between the second voltage level $V_{DD}$ and the rectified voltage level $V_{BST}$. For example, in the steady state, the rectified voltage level $V_{BST}$ may equal the voltage stored on the first capacitive circuit 108 plus the high voltage level of the input signal and/or the voltage charge stored on and/or provided by the external device electrically coupled to the second node 113. In these and other embodiments, in the steady state, the fourth voltage level $V_G$ may be equal to or greater than the high voltage level on the source of the transistor 116.

Additionally, the second driver 109 may not generate the voltage signal when the rectified voltage level $V_{BST}$ is below a rectified threshold voltage (e.g., when the charge pump 101 is in the start-up state). In some embodiments, the rectified threshold voltage may be equal to or less than two volts.

The transistor 116 may receive the voltage signal at the fourth voltage level $V_G$ via the gate. In some embodiments, the transistor 116 may transition from the open position to the closed position when the fourth voltage level $V_G$ is equal to or greater than the high voltage level on the source of the transistor 116.

In some embodiments, the second capacitive circuit 114 may receive the intermediate voltage signal at the rectified voltage level $V_{BST}$ and may receive the second voltage level $V_{DD}$ via the first end of the second capacitive circuit 114. In these and other embodiments, the second capacitive circuit 114 may store a voltage charge that is equal to a voltage difference between the rectified voltage level $V_{BST}$ and the second voltage level $V_{DD}$. In some embodiments, the second diode 110 and/or the second capacitive circuit 114 may provide additional rectification and/or filtering of the intermediate voltage signal.

In some embodiments, the first voltage level $V_{SS}$ may be equal to or less than four hundred fifty volts. In these and other embodiments, the second voltage level $V_{DD}$ may be equal to or less than four hundred fifty five volts. In some embodiments, the first voltage level $V_{SS}$ may be less than the second voltage level $V_{DD}$. In these and other embodiments, the second voltage level $V_{DD}$ may be less than the rectified voltage level.

In some embodiments, the oscillator 104 may include a resistor capacitor (RC) oscillator, or any other appropriate oscillator. In these and other embodiments, the first driver 106 may include a push-pull driver, or any other appropriate driver. Additionally, the first capacitive circuit 108 may include a low voltage capacitor rated for twenty volts or less. Furthermore, the first capacitive circuit 108 may include a metal insulator metal (MIM) capacitor or any other appropriate capacitor.

In some embodiments, the first diode 112 may include a Schottky diode, or any other appropriate diode. In these and other embodiments, the second driver 109 may include a push-pull driver, or any other appropriate driver. Additionally, the second diode 110 may include a Schottky diode, or any other appropriate diode. Furthermore, the second capacitive circuit 114 may include a low voltage capacitor rated for twenty volts or less. Additionally or alternatively, the second capacitive circuit 114 may include a MIM capacitor or any other appropriate capacitor.

In some embodiments, the voltage difference between the first voltage level $V_{SS}$ and the second voltage level $V_{DD}$ may be between one volt and twenty volts. In these and other embodiments, the voltage difference between the second voltage level $V_{DD}$ and the rectified voltage level $V_{BST}$ may be the same or different than the voltage difference between the first voltage level $V_{SS}$ and the second voltage level $V_{DD}$. Additionally, the voltage difference between the second voltage level $V_{DD}$ and the rectified voltage level $V_{BST}$ may be between one volt and twenty volts.

In some embodiments, the power supply 102 may regulate the voltage difference between the first voltage level $V_{SS}$ and the second voltage level $V_{DD}$.

In some embodiments, the first voltage level $V_{SS}$ may be substantially three hundred seventy volts, the second voltage level $V_{DD}$ may be substantially three hundred seventy five volts, the high voltage level may be substantially three hundred seventy five, and the rectified voltage level $V_{BST}$ may be substantially three hundred eighty volts.

In some embodiments, a voltage range of the second voltage level $V_{DD}$ in the start-up state may be between zero volts and five volts. In these and other embodiments, the steady state range may be between fifty volts and three hundred seventy five volts.

The inclusion of the first capacitive circuit 108 as a low voltage capacitor may cause a circuit footprint of the charge pump 101 to be smaller than charge pumps that include high voltage capacitors. Additionally, the circuit footprint of the charge pump 101 may be reduced even more compared to charge pumps that include high voltage capacitors since heat dissipation components (not illustrated) and/or voltage dissipation components (not illustrated) may be reduced due to voltages stored in the first capacitive circuit 108 and the second capacitive circuit 114 being low voltages. Furthermore, since voltages stored in the first capacitive circuit 108 and the second capacitive circuit 114 are low voltages, an amount of voltage that needs to be dissipated when the charge pump 101 is powered down may be reduced compared to charge pumps that include high voltage capacitors.

Modifications, additions, or omissions may be made to FIG. 1 without departing from the scope of the present disclosure. For example, while the system 100 is illustrated as including a single power supply 102, the system 100 may include any number of power supplies 102, such as two power supplies 102 or three power supplies 102. As another example, while the system 100 is illustrated as including a single oscillator 104, the system 100 may include any number of oscillators 104, such as three oscillators 104 or seven oscillators 104. As an additional example, while the system 100 is illustrated as including two drivers 106 & 109, the system 100 may include any number of drivers 106 & 109, such as three drivers 106 & 109 or five drivers 106 & 109. Furthermore, while the system 100 is illustrated as including a single first capacitive circuit 108 and a single second capacitive circuit 114, the system 100 may include any number of first capacitive circuits 108 and second capacitive circuits 114, such as seven first capacitive circuits 108 and three second capacitive circuits 114. While the system 100 is illustrated as including a single first diode 112 and a single second diode 110, the system 100 may include any number of first diodes 112 and second diodes 110, such as two first diodes 112 and eight second diodes 110.

Figure 2:
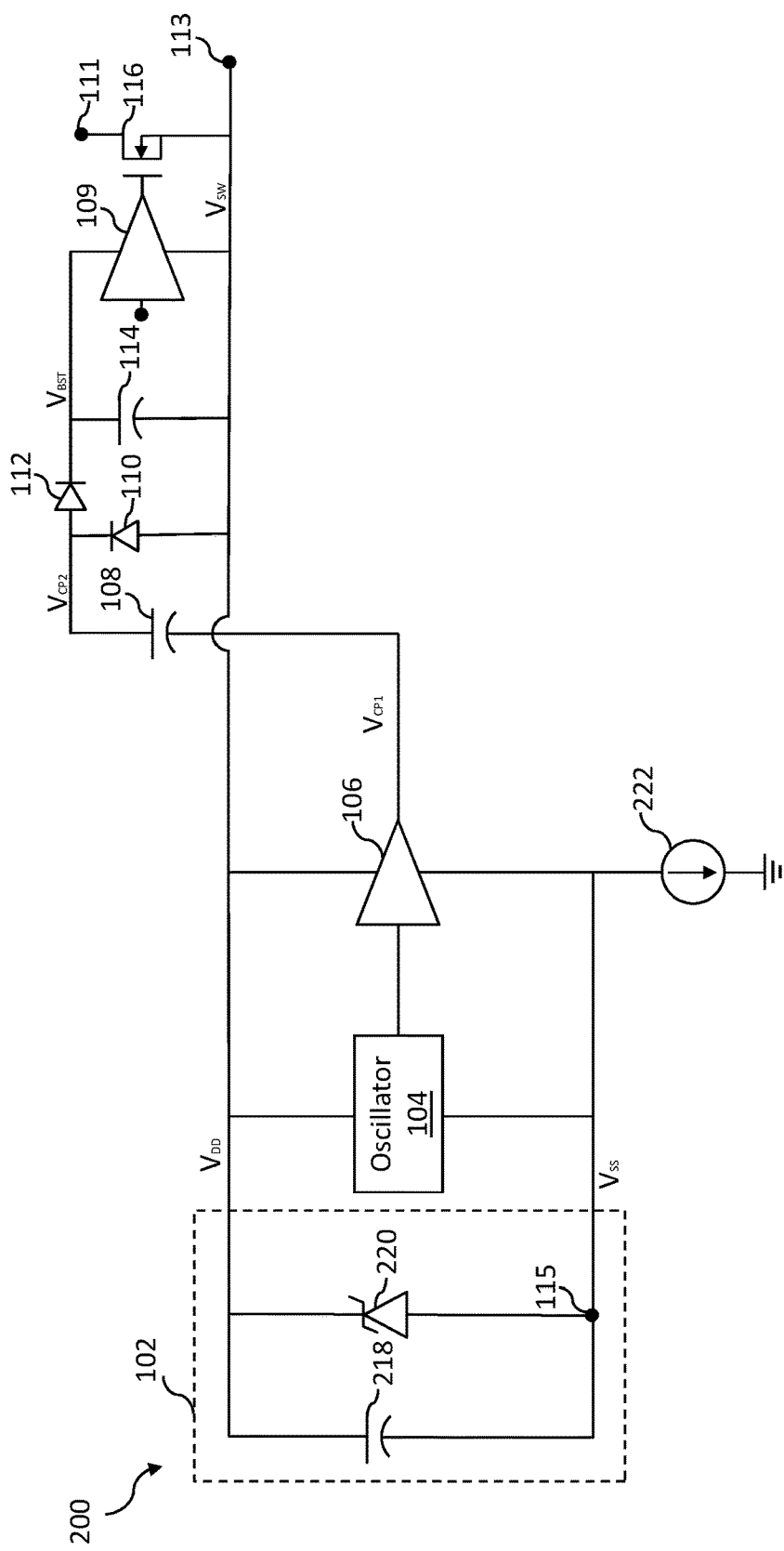
FIG. 2 illustrates another example system of electrical components implementing a floating charge pump.

FIG. 2 illustrates another example system 200 of electrical components implementing a floating charge pump 101, in accordance with one or more embodiments of the present disclosure. The floating charge pump 101 may include a power supply 102, an oscillator 104, a first driver 106, a first capacitive circuit 108, a second capacitive circuit 114, a first diode 112, a second diode 110, and a second driver 109. The power supply 102 may include a shunt regulator diode 220 and a filter capacitive circuit 218. Additionally, the system 200 may include a current source 222. The floating charge pump 101 may be used to operate a transistor 116. In some embodiments, the transistor 116 may include an NFET. The transistor 116 may include a gate, a drain, and a source.

The power supply 102 may be the same or similar to the power supply 102 discussed above in relation to FIG. 1. Additionally, the oscillator 104 may be the same or similar to the oscillator 104 discussed above in relation to FIG. 1. Also, the first driver 106 may be the same or similar to the first driver 106 discussed above in relation to FIG. 1. Furthermore, the first capacitive circuit 108 may be the same or similar to the first capacitive circuit 108 discussed above in relation to FIG. 1.

The second capacitive circuit 114 may be the same or similar to the second capacitive circuit 114 discussed above in relation to FIG. 1. Additionally, the first diode 112 may be the same or similar to the first diode 112 discussed above in relation to FIG. 1. Also, the second diode 110 may be the same or similar to the second diode 110 discussed above in relation to FIG. 1. Furthermore, the second driver 109 may be the same or similar to the second driver 109 discussed above in relation to FIG. 1. The transistor 116 may be the same or similar to the transistor 116 discussed above in relation to FIG. 1.

The current source 222 may be electrically coupled to the first node 115 and the earth ground. A first end of the filter capacitive circuit 218 may be electrically coupled to the first node 115. A second end of the filter capacitive circuit 218 may be electrically coupled to the second node 113. An anode end of the shunt regulator diode 220 may be electrically coupled to the first node 115. A cathode end of the shunt regulator diode 220 may be electrically coupled to the second node 113.

In some embodiments, the power supply 102 may regulate a voltage difference between the first node 115 and the second node 113 as discussed above in relation to FIG. 1. In these and other embodiments, the shunt regulator diode 220 may be rated for a particular DC voltage. The filter capacitive circuit 218 may be rated for the same or similar DC voltage. The current source 222 may drive the filter capacitive circuit 218 as discussed in more detail below. The filter capacitive circuit 218 may store a voltage that is the same or similar to the shunt regulator diode 220 voltage rating. The voltage rating of the shunt regulator diode 220 and/or the filter capacitive circuit 218 may be substantially the same or similar to the voltage difference between the first node 115 and the second node 113. For example, the power supply 102 may be rated for five volts and the voltage difference between the first node 115 and the second node 113 may be substantially equal to five volts.

The first voltage signal and the first voltage level $V_{SS}$ may be the same or similar to the first voltage signal and the first voltage level $V_{SS}$ discussed above in relation to FIG. 1. The first voltage level $V_{SS}$ may be used as a reference voltage for the second voltage level $V_{DD}$, an intermediate voltage signal at an intermediate voltage level $V_{CP1}$, the intermediate voltage signal at a level shifted voltage level $V_{CP2}$, the intermediate voltage signal at a rectified voltage level $V_{BST}$, and a voltage signal at a fourth voltage level $V_G$ in the charge pump 101 as discussed above in relation to FIG. 1.

In some embodiments, the current source 222 may act as a pull-down current source for the power supply 102. In these and other embodiments, the current source 222 may drive the filter capacitive circuit 218 causing the filter capacitive circuit 218 to store a voltage charge equal to the voltage rating of the shunt regulator diode 220. For example, the shunt regulator diode 220 may be rated for five volts DC, and the current source 222 may drive the filter capacitive circuit 218 so that the filter capacitive circuit 218 stores a voltage charge that is substantially five volts DC. In some embodiments, the current source 222 may pull the first voltage level $V_{DD}$ below the high voltage level (e.g., an expected voltage level) of the input signal.

In some embodiments, the charge pump 101 may operate the same or similar to the charge pump 101 discussed above in relation to FIG. 1. In some embodiments, the oscillator 104 may generate a first driver input signal. The first driver input signal may be generated using the first voltage level $V_{SS}$ on the first node 115 and a second voltage level $V_{DD}$ on the second node 113 as reference voltage levels. The first driver 106 may receive the first driver input signal. The first driver 106 may generate an intermediate voltage signal at an intermediate voltage level $V_{CP1}$ using the first voltage level $V_{SS}$ and the second voltage level $V_{DD}$ as reference voltage levels.

In some embodiments, the first capacitive circuit 108 may receive the intermediate voltage signal. In these and other embodiments, the first capacitive circuit 108 may store a voltage charge that is substantially the same or similar to a low voltage rating of the first capacitive circuit 108. Additionally, the first capacitive circuit may output the intermediate voltage signal at a level shifted voltage level $V_{CP2}$. The level shifted voltage level $V_{CP2}$ may be equal to the intermediate voltage level $V_{CP1}$ plus the voltage charge stored on the first capacitive circuit 108.

In some embodiments, the first diode 112 may receive the intermediate voltage signal at the level shifted voltage level $V_{CP2}$. The first diode 112 may rectify and/or filter the intermediate voltage signal. In these and other embodiments, the first diode 112 may output the intermediate voltage signal at a rectified voltage level $V_{BST}$.

In some embodiments, the second driver 109 may receive a second driver input signal via node 117. In these and other embodiments, the second driver 109 may generate a voltage signal at a fourth voltage level $V_G$ using the rectified voltage level $V_{BST}$ and the second voltage level $V_{DD}$ as reference voltage levels. Additionally, the charge pump 101 may operate using the first voltage level $V_{SS}$ as the lower reference voltage (e.g., the charge pump 101 may be floating a voltage equal to the first voltage level above earth ground) as discussed above in relation to FIG. 1.

In some embodiments, the shunt regulator diode 220 may include a Zener diode or any other appropriate circuit. In these and other embodiments, the filter capacitive circuit 218 may include a low voltage capacitor rated for twenty volts or less. Additionally or alternatively, the second capacitive circuit 114 may include a MIM capacitor or any other appropriate capacitor.

Modifications, additions, or omissions may be made to FIG. 2 without departing from the scope of the present disclosure. For example, while the system 200 is illustrated as including a single power supply 102, the system 200 may include any number of power supplies 102, such as two power supplies 102 or three power supplies 102. Additionally, while the power supply 102 is illustrated as including a single shunt regulator diode 220 and a single filter capacitive circuit 218, the power supply 102 may include any number of shunt regulator diodes 220 and filter capacitive circuits 218, such as two shunt regulator diodes 220 and three filter capacitive circuits 218. As another example, while the system 200 is illustrated as including a single oscillator 104, the system 200 may include any number of oscillators 104, such as four oscillators 104 or nine oscillators 104. As an additional example, while the system 100 is illustrated as including two drivers 106 & 109, the system 100 may include any number of drivers 106 & 109, such as four drivers 106 & 109 or seven drivers 106 & 109. While the system 200 is illustrated as including a single first capacitive circuit 108 and a single second capacitive circuit 114, the system 200 may include any number of first capacitive circuits 108 and second capacitive circuits 114, such as four first capacitive circuits 108 and eight second capacitive circuits 114. Additionally, while the system 200 is illustrated as including a single first diode 112 and a single second diode 110, the system 200 may include any number of first diodes 112 and second diodes 110, such as three first diodes 112 and eleven second diodes 110. Furthermore, while the system 200 is illustrated as including a single current source 222, the system 200 may include any number of current sources 222, such as four current sources 222 and seven current sources 222.

In accordance with common practice, the various features illustrated in the drawings may not be drawn to scale. The illustrations presented in the present disclosure are not meant to be actual views of any particular apparatus (e.g., device, system, etc.) or method, but are merely representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," among others).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms "first," "second," "third," etc., connote a specific number of elements, these terms should not be understood to connote a specific number of elements. For example, a first widget may be described as having a first side and a second widget may be described as having a second side. The use of the term "second side" with respect to the second widget may be to distinguish such side of the second widget from the "first side" of the first widget and not to connote that the second widget has two sides.

All examples and conditional language recited in the present disclosure are intended for pedagogical objects to aid the reader in understanding the invention and the concepts contributed by the inventor to furthering the art, and are to be construed as being without limitation to such specifically recited examples and conditions. Although embodiments of the present disclosure have been described in detail, it should be understood that the various changes, substitutions, and alterations could be made hereto without departing from the spirit and scope of the present disclosure.

What is claimed is:

1. A system comprising:
    a first node at a first voltage level and a second node at a second voltage level;
    a switching circuit electrically coupled to the second node, the switching circuit is configured to:
        receive an input signal at a third voltage level and a voltage signal at a fourth voltage level; and
        provide the input signal to the second node when the fourth voltage level of the voltage signal is greater than the third voltage level of the input signal, wherein the second voltage level is equal to the third voltage level when the switching circuit provides the input signal to the second node;
    a first driver electrically coupled to the first node and the second node, the first driver is configured to:
        receive a first driver input signal; and
        generate an intermediate voltage signal at an intermediate voltage level based on the first driver input signal, wherein the intermediate voltage level is between the first voltage level and the second voltage level;
    a first capacitive circuit electrically coupled to an output of the first driver, the first capacitive circuit configured to level shift the intermediate voltage signal to a level shifted voltage level; and
    a second driver electrically coupled to the second node and an output of the first driver and an output of the second driver is electrically coupled to the switching circuit, the second driver is configured to:
        receive a second driver input signal and the level shifted intermediate voltage signal; and
        generate the voltage signal at the fourth voltage level based on the second driver input signal, wherein the fourth voltage level is between the level shifted intermediate voltage level and the second voltage level.

2. The system of claim 1, wherein the first voltage level is less than the second voltage level when the switching circuit provides the input signal to the second node.

3. The system of claim 1 further comprising a voltage source electrically coupled to the first node and the second node, the voltage source is configured to regulate a voltage difference between the first node and the second node.

4. The system of claim 3, the voltage source comprising:
    a filter capacitive circuit, wherein a first end of the filter capacitive circuit is electrically coupled to the first node and a second end of the filter capacitive circuit is electrically coupled to the second node; and
    a shunt regulator diode, wherein a cathode end of the shunt regulator diode is electrically coupled to the second node and an anode end of the shunt regulator diode is electrically coupled to the first node.

5. The system of claim 4, wherein the shunt regulator diode is a Zener diode.

6. The system of claim 1 further comprising an oscillator electrically coupled to the first node, the second node, and an input of the first driver, the oscillator is configured to generate the first driver input signal based on the first voltage level and the second voltage level.

7. The system of claim 1 wherein a first end of the first capacitive circuit is electrically coupled to the output of the first driver and a second end of the first capacitive circuit is electrically coupled to a reference input of the second driver and the first capacitive circuit is driven by the intermediate voltage signal.

8. The system of claim 7, wherein the first capacitive circuit is a low voltage capacitor with a rating of five volts direct current (VDC).

9. The system of claim 7 further comprising a first diode, wherein an anode end of the first diode is electrically coupled to the second end of the first capacitive circuit and a cathode end of the first diode is electrically coupled to the reference input of the second driver, wherein the first diode is configured to rectify and filter the level shifted intermediate voltage signal.

10. The system of claim 9 further comprising a second capacitive circuit, wherein a second end of the second capacitive circuit is electrically coupled to the cathode end of the first diode and the reference input of the second driver and a first end of the second capacitive circuit is electrically coupled to the second node and the second capacitive circuit is also configured to rectify and filter the level shifted intermediate voltage signal.

11. The system of claim 10 further comprising a second diode, wherein a cathode end of the second diode is electrically coupled to the second end of the first capacitive circuit and the anode end of the first diode and an anode end of the second diode is electrically coupled to the second node and the second diode is also configured to rectify and filter the intermediate voltage signal.

12. The system of claim 1, wherein the second voltage level is substantially three hundred seventy five volts when the switching circuit provides the input signal to the second node, the first voltage level is substantially three hundred seventy volts, and the intermediate voltage level is substantially three hundred eighty volts.

13. The system of claim 1 further comprising a current source electrically coupled to the first node and ground, wherein the current source is configured to pull down the first voltage level below an expected voltage level of the input signal.

14. The system of claim 1, wherein the switching circuit comprises a field effect transistor (FET) including a gate, a source, and a drain, wherein the gate is electrically coupled to the output of the second driver, the source is configured to receive the input signal, and the drain is electrically coupled to the second node and configured to provide the input signal to the second node when the fourth voltage level of the voltage signal is greater than the third voltage level of the input signal.

15. A system comprising:
a first node at a first voltage level and a second node at a second voltage level;
a switching circuit electrically coupled to the second node, the switching circuit is configured to:
  receive an input signal at a third voltage level and a voltage signal at a fourth voltage level; and
  provide the input signal when the fourth voltage level of the voltage signal is greater than the third voltage level of the input signal, wherein the second voltage level is equal to the third voltage level when the switching circuit provides the input signal to the second node;
a first driver electrically coupled to the first node and the second node, the first driver is configured to:
  receive a first driver input signal; and
  generate an intermediate voltage signal at an intermediate voltage level based on the first driver input signal, wherein the intermediate voltage level is between the first voltage level and the second voltage level; and
a first capacitive circuit electrically coupled to an output of the first driver, the first capacitive circuit configured to level shift the intermediate voltage signal to a level shifted voltage level;
a second driver electrically coupled to the second node and an output of the first driver and an output of the second driver is electrically coupled to the switching circuit, the second driver is configured to:
  receive a second driver input signal and the level shifted intermediate voltage signal; and
  generate the voltage signal at the fourth voltage level based on the second driver input signal, wherein the fourth voltage level is between the level shifted intermediate voltage level and the second voltage level;
a voltage source electrically coupled to the first node and the second node, the voltage source is configured to regulate a voltage difference between the first node and the second node; and
an oscillator electrically coupled to the first node, the second node, and an input of the first driver, the oscillator is configured to generate the first driver input signal based on the first voltage level and the second voltage level.

16. The system of claim 15, the voltage source comprising:
a filter capacitive circuit, wherein a first end of the filter capacitive circuit is electrically coupled to the first node and a second end of the filter capacitive circuit is electrically coupled to the second node; and
a shunt regulator diode, wherein a cathode end of the shunt regulator diode is electrically coupled to the second node and an anode end of the shunt regulator diode is electrically coupled to the first node.

17. The system of claim 16 wherein a first end of the first capacitive circuit is electrically coupled to the output of the first driver and a second end of the first capacitive circuit is electrically coupled to a reference input of the second driver and the first capacitive circuit is driven by the intermediate voltage signal, the system further comprising a first diode, wherein an anode end of the first diode is electrically coupled to the second end of the first capacitive circuit and a cathode end of the first diode is electrically coupled to the reference input of the second driver, wherein the first diode is configured to rectify and filter the level shifted intermediate voltage signal.

18. The system of claim 17 further comprising:
a second capacitive circuit, wherein a second end of the second capacitive circuit is electrically coupled to the cathode end of the first diode and the reference input of the second driver and a first end of the second capacitive circuit is electrically coupled to the second node and the second capacitive circuit is also configured to rectify and filter the level shifted intermediate voltage signal; and
a second diode, wherein a cathode end of the second diode is electrically coupled to the second end of the first capacitive circuit and the anode end of the first diode and an anode end of the second diode is electrically coupled to the second node and the second diode is also configured to rectify and filter the intermediate voltage signal.

19. The system of claim 18 further comprising:
a current source electrically coupled to the first node and ground, wherein the current source is configured to pull down the first voltage level below an expected voltage level of the input signal.

20. The system of claim 19, wherein the switching circuit comprises a field effect transistor (FET) including a gate, a source, and a drain, wherein the gate is electrically coupled to the output of the second driver, the source is configured to receive the input signal, and the drain is electrically coupled to the second node and configured to provide the input signal to the second node when the fourth voltage level of the voltage signal is greater than the third voltage level of the input signal.

* * * * *